US011127927B2

(12) United States Patent
Hao et al.

(10) Patent No.: US 11,127,927 B2
(45) Date of Patent: *Sep. 21, 2021

(54) COMPOSITION COMPRISING SURFACE MODIFIED HIGH INDEX NANOPARTICLES SUITABLE FOR OPTICAL COUPLING LAYER

(71) Applicant: 3M INNOVATIVE PROPERTIES COMPANY, St. Paul, MN (US)

(72) Inventors: Encai Hao, Woodbury, MN (US); Jonathan A. Anim-Addo, New Hope, MN (US); Guy D. Joly, Shoreview, MN (US); Sergey Lamansky, Redman, WA (US); James P. DiZio, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/839,115

(22) Filed: Apr. 3, 2020

(65) Prior Publication Data

US 2020/0235344 A1 Jul. 23, 2020

Related U.S. Application Data

(60) Continuation of application No. 15/725,020, filed on Oct. 4, 2017, now Pat. No. 10,644,267, which is a division of application No. 14/350,416, filed as application No. PCT/US2013/002551 on Feb. 11, 2013, now Pat. No. 9,818,983.

(60) Provisional application No. 61/604,169, filed on Feb. 28, 2012.

(51) Int. Cl.
| | |
|---|---|
| *C08L 43/04* | (2006.01) |
| *H01L 51/52* | (2006.01) |
| *G02B 1/111* | (2015.01) |
| *G02B 5/02* | (2006.01) |
| *G02B 5/04* | (2006.01) |

(52) U.S. Cl.
CPC .......... *H01L 51/5275* (2013.01); *C08L 43/04* (2013.01); *G02B 1/111* (2013.01); *G02B 5/0294* (2013.01); *G02B 5/045* (2013.01); *H01L 51/5268* (2013.01); *Y10T 156/10* (2015.01); *Y10T 428/31663* (2015.04)

(58) Field of Classification Search
CPC ...................................................... C08L 43/04
See application file for complete search history.

(56) References Cited

U.S. PATENT DOCUMENTS

| | | | |
|---|---|---|---|
| 6,376,590 B2 | 4/2002 | Kolb | |
| 7,140,812 B2 | 11/2006 | Bryan | |
| 7,468,211 B2 | 12/2008 | McCormick | |
| 7,674,868 B2 | 3/2010 | Minge | |
| 7,943,206 B2 | 5/2011 | Jones | |
| 8,314,176 B2 | 11/2012 | Du | |
| 8,469,551 B2 | 6/2013 | Wolk | |
| 8,659,221 B2 | 2/2014 | Jones | |
| 8,692,446 B2 | 4/2014 | Zhang | |
| 9,818,983 B2 * | 11/2017 | Hao | ........................ C08L 43/04 |
| 10,644,267 B2 * | 5/2020 | Hao | ..................... G02B 5/0294 |
| 2003/0031438 A1 | 2/2003 | Kambe | |
| 2006/0148950 A1 | 7/2006 | Davidson | |
| 2006/0175962 A1 | 8/2006 | Fujimoto | |
| 2007/0020451 A1 | 1/2007 | Padiyath | |
| 2008/0145572 A1 | 6/2008 | Yano | |
| 2009/0015142 A1 | 1/2009 | Potts | |
| 2009/0015757 A1 | 1/2009 | Potts | |
| 2010/0110551 A1 | 5/2010 | Lamansky | |
| 2010/0128351 A1 | 5/2010 | Epstein | |
| 2010/0150513 A1 | 6/2010 | Zhang | |
| 2011/0017952 A1 | 1/2011 | Kambe | |
| 2011/0061891 A1 | 3/2011 | Schadler | |
| 2011/0147773 A1 | 6/2011 | Kostka | |
| 2011/0229992 A1 | 9/2011 | Potts | |
| 2011/0262093 A1 | 10/2011 | Lamansky | |
| 2013/0154473 A1 | 6/2013 | Kaneko | |

FOREIGN PATENT DOCUMENTS

| | | |
|---|---|---|
| WO | WO 2003/013846 | 2/2003 |
| WO | WO 2010/051229 | 5/2010 |
| WO | WO 2011/100289 | 8/2011 |
| WO | WO 2011/133518 | 10/2011 |
| WO | WO 2011/133629 | 10/2011 |
| WO | WO 2012/087665 | 6/2012 |

OTHER PUBLICATIONS

International Search Report PCT/US2013/025511; dated Jun. 2, 2013; 4 pgs.

* cited by examiner

*Primary Examiner* — Vickey Nerangis
(74) *Attorney, Agent, or Firm* — Carolyn A. Fischer

(57) ABSTRACT

Presently described is a method for coupling an optical film to a substrate, laminated optical constructions comprising an optical film and an optical coupling layer disposed on a surface layer of the optical film, and coating compositions useful for optical an optical coupling layer. The coating compositions comprise at least 40 wt.-% inorganic nanoparticles having a refractive index of at least 1.85 and a polymeric silane surface treatment.

12 Claims, 4 Drawing Sheets

COMPOSITION COMPRISING SURFACE MODIFIED HIGH INDEX NANOPARTICLES SUITABLE FOR OPTICAL COUPLING LAYER

CROSS REFERENCE TO RELATED APPLICATIONS

This application is a divisional of U.S. patent application Ser. No. 15/725,020, filed Oct. 4, 2017, now allowed, which is a divisional application of U.S. patent application Ser. No. 14/350,416, filed Apr. 8, 2014, now U.S. Pat. No. 9,818,983, issued Nov. 14, 2017, which is a national stage filing under 35 U.S.C. 371 of PCT/US2013/025511, filed Feb. 11, 2013, which claims priority to U.S. Provisional Application No. 61/604,169, filed Feb. 28, 2012, the disclosures of which are incorporated herein by reference in its entirety.

BACKGROUND

Organic Light Emitting Diode (OLED) devices include a thin film of electroluminescent organic material sandwiched between a cathode and an anode, with one or both of these electrodes being a transparent conductor. When a voltage is applied across the device, electrons and holes are injected from their respective electrodes and recombine in the electroluminescent organic material through the intermediate formation of emissive excitons.

In OLED devices, over 70% of the generated light is typically lost due to processes within the device structure. The trapping of light at the interfaces between the higher index organic and indium tin oxide (ITO) layers and the lower index substrate layers is the major cause of this poor extraction efficiency. Only a relatively small amount of the emitted light emerges through the transparent electrode as "useful" light. The majority of the light undergoes internal reflections, which result in its being emitted from the edge of the device or trapped within the device and eventually being lost to absorption within the device after making repeated passes.

Various light extraction films have been described for use with OLED devices for the purpose of increasing the amount of useful light. Industry would find advantage in compositions suitable for coupling light extraction films to OLED devices.

SUMMARY

In one embodiment, a method for coupling an optical film is described comprising: 1) providing an optical film; 2) providing a substrate; 3) applying an optical coupling layer to a surface layer of the optical film, the substrate, or a combination thereof; wherein the optical coupling layer comprises at least 40 wt.-% inorganic nanoparticles having a refractive index of at least 1.85, and a polymeric silane surface treatment; and 4) laminating the optical film to the substrate forming a laminated optical construction.

In other embodiments, laminated optical constructions are described comprising an optical film; an optical coupling layer disposed on a surface layer of the optical film. The optical coupling layer comprises at least 40 wt.-% inorganic nanoparticles having a refractive index of at least 1.85 and a polymeric silane surface treatment. A substrate is bonded to the optical coupling layer at an opposing surface to the optical film. In some embodiments, the optical coupling layer of the method and laminated optical construction is disposed on a surface layer of the optical film wherein the surface layer has a refractive index of at least 1.60. In one embodiment, the laminated optical construction is an intermediate. In this embodiment, the substrate may be a release liner. This intermediate may then be provided to an OLED manufacturer that removes the release liner and bonds the optical coupling layer to an optical substrate such as an organic light emitting diode (OLED) device.

In another embodiment, coating compositions are described comprising at least 40 wt.-% inorganic nanoparticles having a refractive index of at least 1.85 and a polymeric silane surface treatment. In one embodiment, the coating composition may consist entirely of the surface treated inorganic nanoparticles, i.e. the coating composition may be free of (meth)acrylate monomers, particularly those having a molecular weight of 1,000 g/mole or less.

BRIEF DESCRIPTION OF THE DRAWINGS

The accompanying drawings are incorporated in and constitute a part of this specification and, together with the description, explain the advantages and principles of the invention.

As used herein "optical film" generally refers to a light transmissive film. Optical films are typically utilized in a manner wherein an optical film is disposed between a light source and a viewer. The optical coupling layer described herein is particularly suitable to be disposed upon a surface layer of an optical film having a refractive index of at least 1.60, such as the backfill layer of a light extraction film.

Light extraction films and uses of them for OLED devices are known. Light extraction film generally refers to film having extraction elements that enhance light extraction from self-emissive light sources. The extraction elements (also referred to as extraction features or extraction structures) are nanostructures or microstructures that can optionally be periodic, quasi-periodic, random, or may comprise multiple zones with different periodic structures in each zone. For embodiments where the extraction elements are non-random structures, the extraction elements may be referred to as engineered structures, or engineered nanostructures. Examples of light extraction films are described in U.S. Patent Applications Publication Nos. 2009/0015757, 2009/0015142, 2011/0262093 and in U.S. patent application Ser. No. 13/218,610, incorporated herein by reference.

Figure 1:
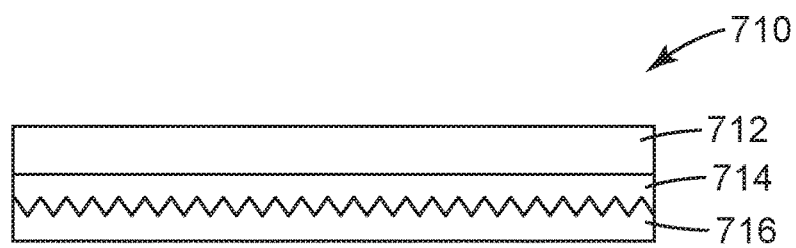
FIG. 1 is a diagram illustrating layers of a light extraction film.

Light extraction film typically includes a substantially transparent (flexible or rigid) substrate, extraction elements, and a planarizing backfill layer. FIG. 1 is a diagram of the construction of a light extraction film 710. Light extraction film 710 includes a substantially transparent substrate 712 (flexible or rigid), low index extraction elements 714, and a high index backfill layer 716 forming a substantially planar surface over extraction elements 714. The term "substantially planar surface" means that the backfill layer planarizes the underlying layer, although slight surface variations may be present in the substantially planar surface.

Figure 2:
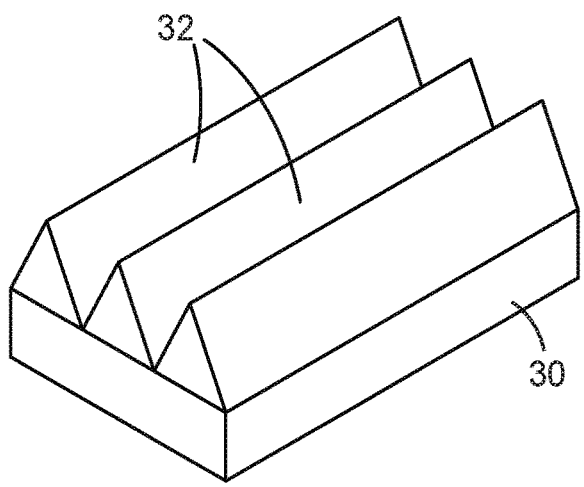
FIG. 2 is a perspective diagram of one-dimensional periodic structures.
Figure 3:
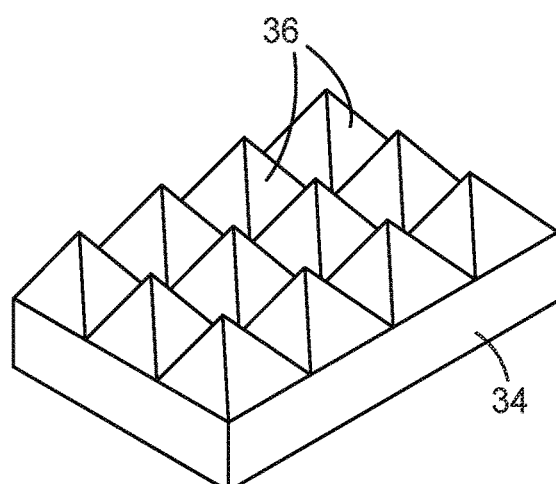
FIG. 3 is a perspective diagram of two-dimensional periodic structures.

The extraction elements for light extraction films can be formed integrally with the substrate, or formed in a layer applied to the substrate as illustrated for example in FIGS. 1-3. For example, the extraction elements can be formed on the substrate by applying to the substrate a low-index material and subsequently patterning the material. The extraction elements may be nanostructures or microstructures. Nanostructures are structures having at least one dimension, such as width, less than 1 micron. Microstructures are structures having at least one dimension, such as width, between 1 micron and 1 millimeter. The extraction elements for light extraction films can be one-dimensional (1D) periodic structures, meaning the extraction elements are periodic in only one dimension, that is, nearest-neighbor features are spaced equally in one direction along the surface, but not along the orthogonal direction. In the case of 1D periodic nanostructures, the spacing between adjacent periodic features is less than 1 micron. One-dimensional structures include, for example, continuous or elongated prisms or ridges, or linear gratings. FIG. 2 is a perspective view illustrating one embodiment of 1D periodic structures 32, in this example linear prisms, on a substrate 30.

The extraction elements for light extraction films, can also be two-dimensional (2D) periodic structures, meaning the extraction elements are periodic in two dimensions, that is, nearest neighbor features are spaced periodically in two different directions along the surface. In the case of 2D nanostructures, the spacing in both directions are less than 1 micron. Note that the spacing in the two different directions may be different. Two-dimensional structures include, for example, lenslets, pyramids, trapezoids, round or square shaped posts, or photonic crystal structures. Other examples of two-dimensional structures include curved sided cone structures as described in U.S. Patent Application Publication No. 2010/0128351, incorporated herein by reference. FIG. 3 is a perspective view illustrating one embodiment of 2D periodic structures 36, in this example pyramids, on a substrate 34.

Extraction elements arranged as a periodic structure with a single spacing between extraction elements may be referred to as single-pitch or single-period structures. An alternative configuration of extraction elements, referred to as multi-pitch or multi-periodic structures, is extraction elements, typically engineered nanostructures, arranged into multiple zones with different periodic characteristics in each zone. FIGS. 4A-4E illustrate various configurations of zones of multi-periodic structures having at least different pitches. A zone is a plurality of sets of extraction elements proximate one another and non-overlapping. The sets can be directly adjacent one another, or adjacent one another and separated by a gap. Each set is a plurality of extraction elements adjacent one another with a periodic characteristic, and each set in a zone has a different periodic characteristic from the other sets in the zone. The extraction elements in each set are thus not random and are not non-periodic. The zone repeats throughout the nanostructured surface of the light extraction film. In particular, the same plurality of sets in a zone repeats, resulting in a repeating variable periodic characteristic of the extraction elements. The plurality of extraction elements in a set can include as few as two extraction elements, in which case the pitch (when used as the multi-periodic characteristic) is only the single distance between the two extraction elements in the set.

Examples of periodic characteristics include pitch, height, aspect ratio, and shape. Pitch refers to the distance between adjacent extraction elements, typically measured from their topmost portions. Height refers to the height of the nanostructures measured from their base (in contact with the underlying layer) to the topmost portion. Aspect ratio refers to the ratio of the cross-sectional width (widest portion) to height of the extraction elements. Shape refers to the cross-sectional shape of the extraction elements.

Controlling pitch through multi-pitch zones has been found to provide better angular distribution of OLED light extraction when compared with using a single pitch. Also, using multi-pitch zones provides for more uniform OLED light extraction and allows for tuning the light extraction for specific colors. The light extraction films thus use multi-periodic zones of pitch and may combine the multi-pitch zones with other multi-periodic characteristics such as those described above.

FIGS. 4A-4E show prisms (or pyramids) as the extraction elements for illustrative purposes. Extraction elements can include other types of 1D and 2D features, such as those described above.

Figure 4A:
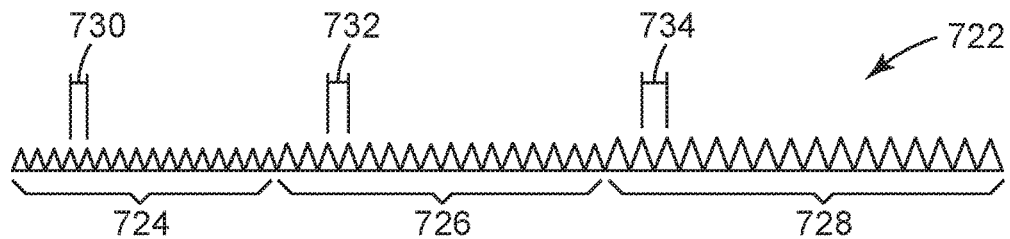
FIG. 4A is a diagram illustrating a first multi-periodic zone of nanostructures with different pitches.

FIG. 4A illustrates nanostructured surface 722 with a zone having sets of extraction elements 724, 726, and 728. Each of the sets 724, 726, and 728 has a different pitch and feature height compared to the pitches and feature heights of the other sets in the zone. Set 724 has a periodic pitch 730, set 726 has a periodic pitch 732, and set 728 has a periodic pitch 734. The pitches 730, 732, and 734 do not equal each other. In one particular embodiment, pitch 730=0.420 microns, pitch 732=0.520 microns, and pitch 734=0.630 microns. The sets 724, 726, and 728 constituting the zone would then repeat to form the nanostructured surface of the light extraction film.

Figure 4B:
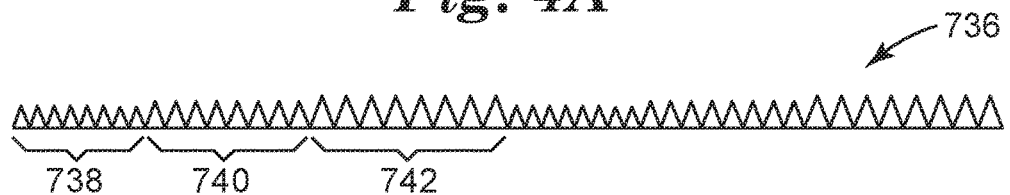
FIG. 4B is a diagram illustrating a second multi-periodic zone of nanostructures with different pitches.

FIG. 4B illustrates nanostructured surface 736 with a repeating zone having sets of extraction elements 738, 740, and 742 each having a periodic pitch and feature height different from the other sets. In nanostructured surface 736, the zone is shown repeated twice. This example has fewer features in each set compared with the sets in FIG. 4A.

Figure 4C:
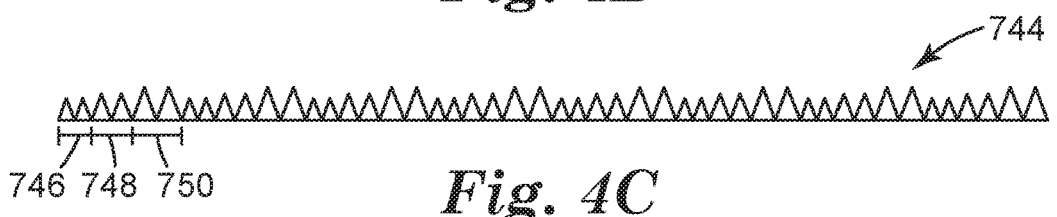
FIG. 4C is a diagram illustrating a third multi-periodic zone of nanostructures with different pitches.

FIG. 4C illustrates nanostructured surface 744 with a repeating zone having sets of extraction elements 746, 748, and 750 each having a periodic pitch and feature height different from the other sets. In nanostructured surface 744, the zone is shown repeated eight times. This example has fewer features in each set compared with the sets in FIGS. 4A and 4B.

Figure 4D:
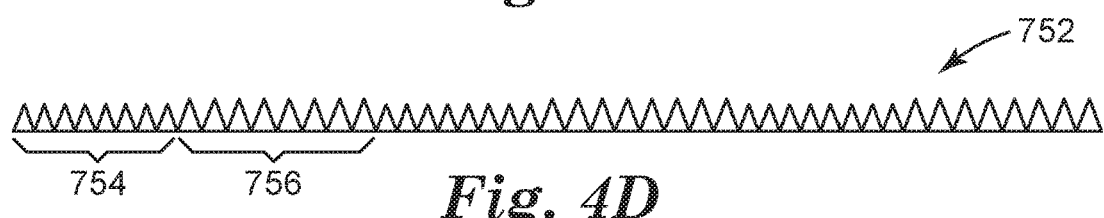
FIG. 4D is a diagram illustrating a fourth multi-periodic zone of nanostructures with different pitches.

FIG. 4D illustrates nanostructured surface 752 with a repeating zone having sets of extraction elements 754 and 756 each having periodic a pitch and feature height different from the other set. In nanostructured surface 752, the zone is shown repeated three times. This example illustrates a zone having two sets compared with the zones having three sets in FIGS. 4A-4C.

Figure 4E:
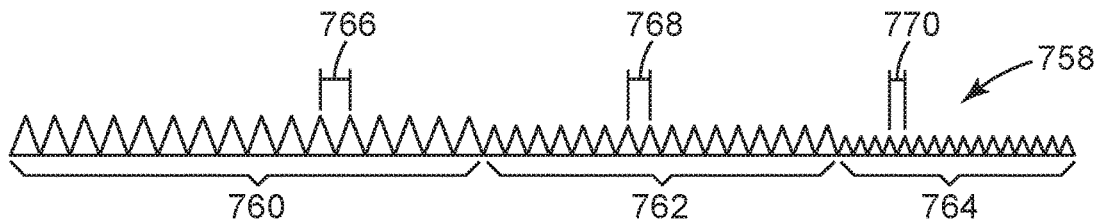
FIG. 4E is a diagram illustrating a fifth multi-periodic zone of nanostructures with different pitches.

FIG. 4E illustrates nanostructured surface 758 with a zone having sets of extraction elements 760, 762, and 764. Each of the sets 760, 762, and 764 has a different pitch and feature height compared to the pitches and feature heights of the other sets in the zone. Set 760 has a periodic pitch 766, set 762 has a periodic pitch 768, and set 764 has a periodic pitch 770. The pitches 766, 768, and 770 do not equal each other. In one particular embodiment, pitch 766=0.750 microns, pitch 768=0.562 microns, and pitch 770=0.375 microns. The sets 760, 762, and 764 constituting the zone would then repeat to form the nanostructured surface of the light extraction film. This example illustrates a varying pitch in a zone increasing in a different direction compared with the varying pitch in the sets of FIG. 4A.

Figure 4F:
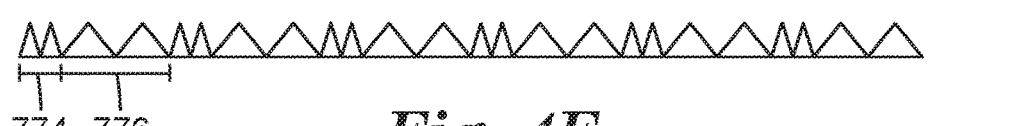
FIG. 4F is a diagram illustrating a multi-periodic zone of nanostructures with different aspect ratios
Figure 4G:
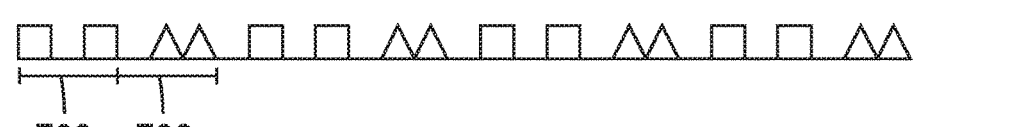
FIG. 4G is a diagram illustrating a multi-periodic zone of nanostructures with different shapes.

Aside from pitch and feature height, multi-periodic zones can have sets of other multi-periodic characteristics. FIG. 4F illustrates nanostructured surface 772 having sets of extraction elements with multi-periodic aspect ratios. The repeating zone for nanostructured surface 772 includes sets 774 and 776 with the extraction elements in set 774 having a different aspect ratio from the extraction elements in set 776. As another example, FIG. 4G illustrates nanostructured surface 778 having sets of extraction elements with multi-periodic shapes. The repeating zone for nanostructured surface 778 includes sets 780 and 782 with the extraction elements in set 780 having a different shape from the extraction elements in set 782. In this example, the extraction elements in set 780 can be 1D square ridges or 2D square posts, while the extraction elements in set 782 can be 1D elongated prisms or 2D pyramids.

The extraction elements in FIGS. 4A-4G are illustrative of periodic characteristics and zones. A zone can have two, three, or more sets of extraction elements with a periodic characteristic in each set and different from the values of the same periodic characteristic in the other sets. In FIGS. 4A-4E, the different pitches among sets in a zone are accomplished using extraction elements of different heights. However, the height of the extraction elements can be the same while the pitch among sets is different. The sets in a zone can thus have one or more different periodic characteristics among them.

Figure 5:
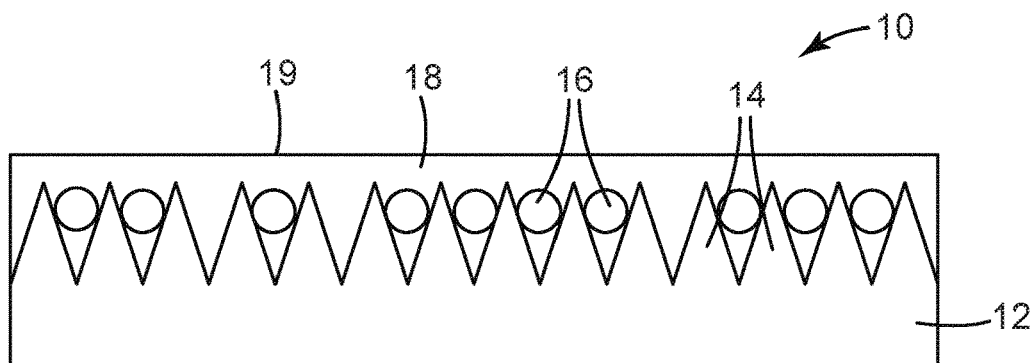
FIG. 5 is a diagram of a light extraction film having nanoparticles applied in a sub-monolayer over periodic structures.

Light extraction elements can also be formed from nanoparticles or from the combination of nanoparticles and regular or random elements separately created on a light extraction film substrate. FIG. 5 is a diagram of the construction of one illustrative light extraction film 10 having periodic structures with nanoparticles positioned on the periodic structures. In the embodiment shown in FIG. 5, the extraction elements are the combination of the periodic structures and the nanoparticles. Light extraction film 10 includes a substantially transparent (flexible or rigid) substrate 12, low index periodic structures 14, optional nanoparticles 16 are preferably dispersed in a surface layer manner over periodic structures 14, and a high index planarizing backfill layer 18 forming a substantially planar surface 19 over periodic structures 14 and nanoparticles 16.

Figure 6:
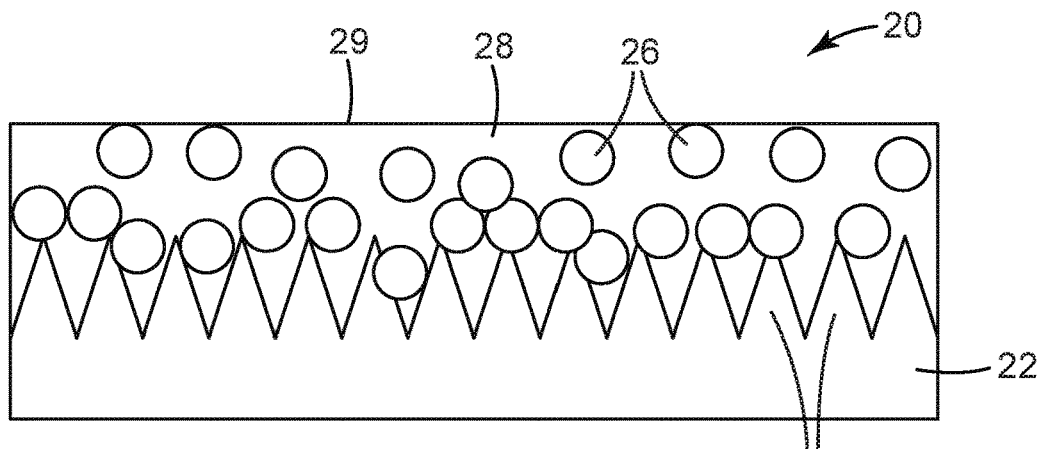
FIG. 6 is a diagram of a light extraction film having nanoparticles distributed throughout a backfill layer.

FIG. 6 is a diagram of the construction of another light extraction film 20 having periodic structures and nanoparticles. Light extraction film 20 includes a substantially transparent (flexible or rigid) substrate 22, low index periodic structures 24, nanoparticles 26, and a high index planarizing backfill layer 28 forming a substantially planar surface 29 over periodic structures 24 and nanoparticles 26. In this embodiment, nanoparticles 26 are distributed throughout backfill layer 28, such as in a volume distribution, rather than in a surface layer manner as shown for light extraction film 10.

The optional nanoparticles, also referred to as sub-micron particles, for light extraction films 10 and 20 have a size within the range for nanostructures and can be the same size or different sizes within that range for a particular film. The nanoparticles are also light scattering when the nanoparticles are within a particular size range and have a different index of refraction from the backfill layer, as further explained below. For example, the nanoparticles can have diameters in the range of 100 nm to 1,000 nm, or the nanoparticles can have diameters in the range of 10 nm to 300 nm and form agglomerations with sizes in the range of 100 nm to 1,000 nm. Furthermore, the nanoparticles can comprise mixed particles sizes, large and small nanoparticles mixed together such as 300 nm nanoparticles mixed with 440 nm or 500 nm nanoparticles, which can result in an increased spectral response of the corresponding light extraction film. The nanoparticles can possibly have sizes outside the range for nanostructures depending upon a particular application. For example, if the light extraction film is used for OLED lighting, as opposed to displays, then the nanoparticles can have diameters up to several microns. The nanoparticles can be composed of organic materials or other materials, and they can have any particle shape, regular or irregular. The nanoparticles can be porous particles. Examples of nanoparticles used in light extraction films are described in U.S. Patent Application Publication No. 2010/0150513, incorporated herein by reference.

For light extraction film 10 having optional nanoparticles 16 distributed in a surface layer manner, the layer of nanoparticles can be nanoparticles in a monolayer, with a layer having agglomerations of nanoparticles, or in a multilayer. The nanoparticles can be coated without use of a binder, which can result in the agglomerations of nanoparticles. In a preferred embodiment, nanoparticles 16 have a size, for example diameter, substantially equal to or slightly less than the pitch (e.g., one-fourth to one times the pitch) of periodic structures 14 such that the nanoparticles are at least partially ordered by the periodic structures. The at least partial ordering can occur through the particles becoming aligned or assembled within the periodic structures. The pitch of the periodic structures refers to the distance between adjacent structures, for example the distance between the apexes of adjacent prisms. Size matching can be used to achieve the at least partial ordering, for example 440 nm nanoparticles with 600 nm pitch periodic structures or 300 nm nanoparticles with 500 nm pitch periodic structures. In addition, the shape and aspect ratio of the periodic structures can be factors in determining the size matching and partial ordering of the nanoparticles.

The planarizing backfill layers for light extraction films (e.g. 10, 20 and 716) are applied over the extraction elements to planarize them and provide for index contrast. Low index extraction elements with a high index backfill layer means that backfill layer has a higher index of refraction than the extraction elements and that the backfill layer and extraction elements have a sufficient difference in refractive indices, preferably 0.2 or greater, to enhance light extraction of an OLED device in optical communication with the light extraction films. The light extraction film can be in optical communication with the OLED device by having the planar surface of the backfill layer placed against, either directly or through another layer, the light output surface of the OLED device. The planarizing backfill layer can optionally be an adhesive for bonding the light extraction film to the light output surface of the OLED device. Examples of high index backfill layers for light extraction films are described in U.S. Patent Application Publication No. 2010/0110551, incorporated herein by reference.

Materials for the substrates, low index extraction elements, high index backfill layers, and optional nanoparticles for light extraction films (e.g. 10 and 20) are provided in the published patent applications previously cited. For example, the substrate can be glass, PET, polyimides, TAC, PC, polyurethane, PVC, or flexible glass. Processes for making light extraction films (e.g. 10, 20 and 716) are also provided in the published patent applications identified above. Optionally, the substrate can be a barrier film to protect a device incorporating the light extraction film from moisture or oxygen. Examples of barrier films are disclosed in U.S. Patent Application Publication No. 2007/0020451 and U.S. Pat. No. 7,468,211; incorporated herein by reference.

Figure 7:
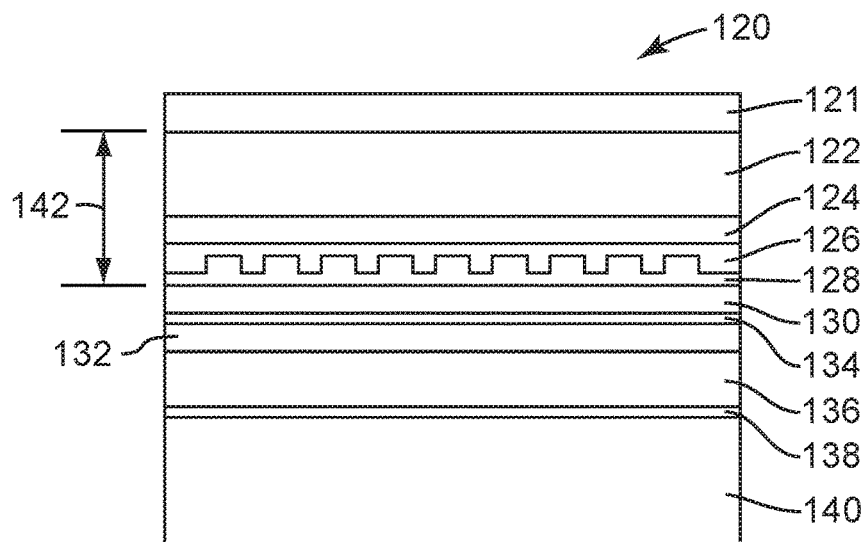
FIG. 7 is a diagram of a top emitting OLED display device with a light extraction film.

FIG. 7 illustrates light extraction film 142 incorporated into a top emitting OLED device 120. The Table below describes elements of device 120 and the arrangement of those elements, as identified by the reference numbers provided in FIG. 7. The configuration shown in FIG. 7 is provided for illustrative purposes only, and other configurations of OLED display devices are possible. Light extraction film 142 includes a substantially transparent substrate 122 (flexible or rigid), optional barrier layer 124, low index extraction elements 126, and a high index planarizing backfill layer 128 forming a substantially planar surface over extraction elements 126. Applying a light extraction film to an OLED device means that the light extraction film is placed at an appropriate location within the OLED device as, for example, described in FIG. 7 and the Table below.

| Top Emitting OLED Device with Light Extraction Film | |
|---|---|
| Ref No. | Type of Element |
| 121 | optional functional layers |
| 122 | light extraction film substrate |
| 124 | optional barrier layer |
| 126 | low index structure |
| 128 | high index backfill |
| 130 | optical coupling layer |
| 132 | electrode 1 |
| 134 | optional thin film encapsulant layer or optional capping layer |
| 136 | organic layers |
| 138 | electrode 2 |
| 140 | device substrate |
| 142 | light extraction film |

Figure 8:
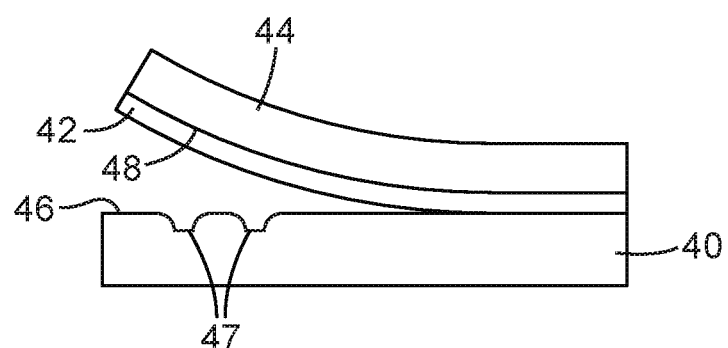
FIG. 8 is a diagram illustrating laminating a light extraction film to an OLED device.
Figure 9:
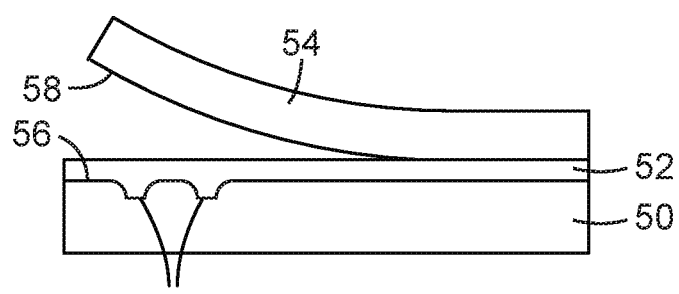
FIG. 9 is a diagram illustrating laminating a light extraction film to an OLED device.

In one embodiment, a method for coupling an optical film is described. The method comprises providing an optical film having a surface layer having a refractive index of at least 1.60; providing a substrate; applying an optical coupling layer to the surface layer of the optical film, the substrate, or a combination thereof; and laminating the optical film to the substrate forming a laminated optical construction. As will subsequently be described in greater detail, the optical coupling layer comprises at least 40 wt.-% inorganic nanoparticles having a refractive index of at least 1.85, and a polymeric silane surface treatment;

FIGS. 8 and 9 illustrate some embodied methods laminating an (e.g. light extraction) optical film to a substrate (e.g. OLED device) by use of an optical coupling layer forming a laminated optical construction.

As shown in FIG. 8, an optical coupling layer 42 is applied to a planar surface 48 of the backfill layer in a light extraction film 44, which can then be laminated to a light output surface 46 of an OLED device 40. The optical coupling layer can be an adhesive providing for optical coupling between the light output surface of the OLED device and the backfill layer of the light extraction film. Use of an adhesive as the optical coupling layer along with a lamination process can also serve to adhere the light extraction film to the OLED device and remove air gaps between them. The backplane morphology of the OLED device is typically non-planar, as represented by pixel wells 47, and optical coupling layer 42 is expected to conform to or expand into the pixel well geometry filling the gap between light extraction film 44 and OLED device 40.

Alternatively, as shown in FIG. 9, an optical coupling layer 52 is applied to a light output surface 56 of an OLED device 50, and a planar surface 58 of the backfill layer in a light extraction film 54 is then laminated to OLED device 50. If the adhesive optical coupling layer is applied to the OLED device before lamination of the light extraction film, as shown in FIG. 9, the optical coupling layer can also serve to planarize the light output surface of the OLED device. For example, a top emitting active matrix OLED display backplane does not necessarily have a high degree of planarity, as represented by pixel wells 57, in which case the optical coupling layer can be pre-deposited onto the cathode or any other top layer of the OLED stack prior to lamination of the light extraction film. Such pre-deposition of the optical coupling layer can reduce non-planarity of the backplane and the device, allowing for subsequent lamination of the light extraction film. The optical coupling layer in this case can be coated onto the OLED display with solution deposition methods. For example, it can be applied onto the entire area of the OLED from a liquid formulation, in which case after lamination of the light extraction film it can be optionally cured using UV or thermal curing methods. It can also be laminated as an optical coupling film provided separately between two liners with prior removal of the liner facing the OLED device, in which case it is expected to conform or expand into the pixel wells. After application of the optical coupling layer a sufficient planarization over the backplane morphology is produced as shown in FIG. 9.

Since the backplane morphology determines the distance between the extraction elements (nanoparticles and periodic structure) and OLED devices, the materials for the optical coupling layer typically have a high index of refraction, at least 1.65 or 1.70 up to 2.2 comparable to that of OLED organic and inorganic layers (e.g., ITO).

The axial gain (as measured according to the test method described in the examples) is typically at least 1.5 or 2. In some embodiments, the axial gain is no greater than about 3. Further, the integrated gain may be at least 1.5, or 1.6, or 1.7. In some embodiments, the axial gain is no greater than about 2.

In addition to having the proper refractive index, the optical coupling layer must be sufficiently transparent with a transmission of at least 80% or 85%. Typically the haze is no greater than 10% or 5%. Further, the optical coupling layer must sufficiently adhere to both the (e.g. top emitting) OLED device and the light extraction film (e.g. backfill layer).

The methods just described can produce one class of laminated optical constructions. In another embodiment, the laminated optical construction is an intermediate. In this embodiment, the substrate may be a release liner For example, light extraction film 44 of FIG. 6 comprising optical coupling layer 42 applied to planar surface 48 may temporarily further comprise a release liner releasably attached to optical coupling layer 43. This intermediate may then be provided to an OLED manufacturer that removes the release liner and bonds the optical coupling layer to an optical substrate such as an organic light emitting diode (OLED) device.

Also described are coating compositions suitable for use as an optical coupling layer of an OLED device or other optical device wherein a high refractive index optical coupling layer is desired.

The coating composition comprises high refractive index inorganic nanoparticles. Such inorganic nanoparticles have a refractive index of at least 1.85, 1.90, 1.95, 2.00 or higher.

Various high refractive index nanoparticles are known, including for example zirconia ("$ZrO_2$"), titania ("$TiO_2$"), antimony doped tin oxides, tin oxides, alone or in combination. Mixed metal oxide may also be employed. In some favored embodiments, the inorganic nanoparticles are "titania nanoparticles", that refers to a nanoparticles having at least a titania core. Typically substantially the entire nanoparticle including the surface is entirely titania.

High index metal oxide sols can be favored since such are easier to surface treat and remain well dispersed. Zirconias sols are available from Nalco Chemical Co. under the trade designation "Nalco 00SS008", Buhler AG Uzwil, Switzerland under the trade designation "Buhler zirconia Z-WO sol" and Nissan Chemical America Corporation under the trade name NanoUse ZR™. Zirconia nanoparticles can also be prepared such as described in U.S. Patent Publication No. 2006/0148950 and U.S. Pat. No. 6,376,590. A nanoparticle dispersion that comprises a mixture of tin oxide and zirconia covered by antimony oxide (RI~1.9) is commercially available from Nissan Chemical America Corporation under the trade designation "HX-05M5". A tin oxide nanoparticle dispersion (RI~2.0) is commercially available from Nissan Chemicals Corp. under the trade designation "CX-S501M". Less preferred $TiO_2$ sols are available typically dispersed in strong acid or base condition such as the $TiO_2$ sol under the trade designation STS-01 from Ishhihara Sangyo Kaisha Ltd. $TiO_2$ sols, commercially available from Showa Denko Corp under the trade designation NTB-01 and from Taki chemical Co. Ltd under the trade designation AM-15, are stable sols with weak acid (ph=4~5) can be preferred sols.

Generally, the nano-sized particles have an average core diameter of less than 100 nm, and more typically less than 50 nm. In some embodiments, the nano-sized particles have an average core diameter of at least 5 nm. In some embodiments, the nano-sized particles have an average core diameter ranging from 10 to 20 nm.

Although other methods such as titration and light scattering techniques may be used, the particle size referred to herein is based on transmission electron microscopy (TEM). Using this technique, TEM images of the nanoparticles are collected, and image analysis is used to determine the particle size of each particle. A count-based particle size distribution is then determined by counting the number of particles having a particle size falling within each of a number of predetermined discrete particle size ranges. The number average particle size is then calculated. One such method is described in U.S. Provisional Application 61/303,406 ("Multimodal Nanoparticle Dispersions, Thunhorst et al.) filed 11 Feb. 2010, and will be referred to herein as the "Transmission Electron Microscopy Procedure".

According to the Transmission Electron Microscopy Procedure, to measure the particle size and particle size distribution, a nanoparticle sol is diluted by taking 1 or 2 drops of sol and mixing it with 20 mL of deionized distilled water. The diluted samples are sonicated (Ultrasonic Cleaner, Mettler Electronics Corp., Anaheim, Calif.) for 10 minutes and a drop of the diluted sample is placed on a 200 mesh Cu TEM grid with a carbon/Formvar film (Product 01801, Ted Pella, Inc, Redding, Calif.), and dried at ambient conditions. The dried samples are imaged using a Transmission Electron Microscope (TEM) (HITACHI H-9000NAR, Hitachi, Ltd., Tokyo, Japan) at 300 kV with magnifications ranging from 10K times to 50K times depending on the particle sizes in each sample. Images are captured using Gatan Digital Micrograph software on a CCD camera (ULTRASCAN 894, Gatan, Inc., Pleasanton, Calif.). Each image has a calibrated scale marker. Particle sizes are measured using a single line through the center of each particle; thus, the measurements are based in the assumption that the particles are spherical. If a particular particle is non-spherical, the measurement line is taken through the longest axis of the particle. In each case, the number of measurements taken on individual particles exceeds that stipulated in the ASTM E122 test method for the error level of 5 nm.

The optical coupling layer comprises a relatively high concentration of inorganic nanoparticle having a refractive index of at least 1.85. The optical coupling layer typically comprises at least 40 wt.-% of such inorganic nanoparticles. In some embodiments, the concentration of high refractive index nanoparticle is at least 45 wt.-%, 50 wt.-%, or 55 wt.-%. Typically the concentration of inorganic nanoparticles is no greater than about 75 wt.-% or 70 wt.-%.

The high refractive index nanoparticles are surface treated with a polymeric silane surface treatment.

Generally, a "polymeric silane surface treatment" comprises polymerized or copolymerized repeat units and alkoxy silane groups. The alkoxy groups react with hydroxy groups on the surface of a titania nanoparticle forming a covalent bond between the surface treatment agent and the titania surface.

The polymeric silane surface treatment generally comprises a low molecular weight polymer. In some embodiments, the polymeric silane surface treatment has a weight average molecular weight of at least 1000 gm/mole, or 1500 gm/mole, or 2000 gm/mole. The weight average molecular weight of the polymeric silane surface treatment is typically no greater than 20,000 gm/mole, 10,000 gm/mole, or 5,000 gm/mole. For the polymeric silane surface treatment, the weight average molecular weight is calculated according to Gel Permeation Chromatography (GPC).

The polymeric silane surface treatment typically comprises a (e.g. random) acrylic copolymer comprising the reaction product of one or more (meth)acrylate monomerss. As used herein, "(meth)acrylate" refers to an acrylate and/or methacrylate.

The acrylic copolymer comprises repeat units derived from one or more first alkyl (meth)acrylates comprising 4 to 18 carbon atoms. In some embodiments, the acrylic copolymer comprises at least 50 wt. %, or 60 wt. %, or 70 wt.-% of repeat units derived from alkyl (meth)acrylates having 4 to 18 carbon atoms based on the total weight of the acrylic copolymer. In some embodiments, the acrylic copolymer comprises no greater than 98 wt. %, or 95 wt. % of repeat units derived from alkyl (meth)acrylates containing 4 to 18 carbon atoms. In some embodiments, the acrylic copolymer comprises repeat units derived from first alkyl (meth)acrylates having at least 6 carbon atoms. In some embodiments, the acrylic copolymer comprises repeat units derived from first alkyl (meth)acrylates having at least eight carbon atoms, (e.g., isooctyl (meth)acrylate and/or 2-ethylhexyl (meth)acrylate) and typically no greater than 12 carbon atoms.

The high concentration of alkyl (meth)acrylates containing at least 4, 5, 6, 7, or 8 carbon atoms contributes to the low glass transition temperature (Tg) of the polymeric silane surface treatment. In some embodiments, the Tg of polymeric silane surface treatment is less than −20° C., or −30° C., or −40° C., or −50° C., or −60° C. The Tg of polymeric silane surface treatment is typically at least −80° C.

When the polymeric silane surface treatment is utilized as a surface treatment on the high refractive index nanoparticles, the inclusion of the nanoparticles, optionally in combination with a crosslinker, typically raises the Tg by at least about 10° C., or 15° C., or 20° C. Thus, the surface treated high index particle composition (e.g. optical coupling layer) typically has a Tg of less than 0° C., or −10° C., or −20° C., or −30° C., or −40° C. The Tg of the surface treated high index particle composition is typically at least −60° C.

In some embodiments, the polymeric silane surface treatment comprises repeat units derived from at least one alkyl (meth)acrylate that contains less carbon atoms than the first alkyl (meth)acrylate. In some embodiments, the polymeric silane surface treatment comprises repeat units derived from at least one alkyl (meth)acrylate having 1-3 carbon atom or 1-2 carbons atoms, (e.g. ethyl acrylate). In some embodiments, the acrylic copolymers comprise at least 1 wt. %, or 2 wt. %, or 3 wt.-% of repeat units derived from alkyl (meth)acrylates containing 1-3 carbon atoms or 1-2 carbon atoms based on the total weight of the acrylic copolymer. In some embodiments, the polymeric silane surface treatment comprises no greater than 20 wt. %, or 15 wt. %, or 10 wt. %, repeat units derived from alkyl (meth)acrylates containing 1-3 carbon atoms, or 1-2 carbon atoms. In some embodiments, such short chain alkyl (meth)acrylates may further comprise a hydroxyl group. For example, by use of a hydroxy-alkyl acrylate, pendant hydroxy functionality can be incorporated into the polymeric silane surface treatment. Such pendant hydroxy functionality can be crosslinked with a hydroxy-reactive crosslinker such a polyisocyanate or an epoxy.

In some embodiments, the polymeric silane surface treatment comprises repeat units derived from a vinyl carboxylic acid such as acrylic acid, methacrylic acid, itaconic acid, maleic acid, fumaric acid, and β-carboxyethylacrylate. In some embodiments, the acrylic copolymers comprise at least 0.1% wt. %, or 0.2 wt. %, or 0.3 wt.-% of repeat unit derived from vinyl carboxylic acid (e.g. acrylic acid) based on the total weight of the acrylic copolymer. When the polymeric silane surface treatment comprises repeat units derived from a vinyl carboxylic acid, the polymer comprises pendant carboxylic acid groups than can be crosslinked with a carboxylic acid-reactive crosslinker such as an aziridine or melamine crosslinker.

In some embodiments, the polymeric silane surface treatment comprises repeat units comprising pendant reactive groups such as hydroxyl groups, acid groups, or amine groups. The acrylic polymer typically comprises no greater than 15 wt. % or 10 wt. %, and in some embodiments, no greater than 5 wt. %, or 4 wt. %, or 3 wt. %, or 2 wt. %, or 1 wt-% of monomers contributing such pendant reactive groups Such pendant functionality can be crosslinked with a crosslinker. The concentration of crosslinker is typically at least 0.1 wt-% and no greater than 5 wt. %, or 4 wt. %, or 3 wt. %, or 2 wt. %, or 1 wt-%. Thus, the polymeric silane surface treatment comprises a relatively low level of crosslinking.

The polymeric silane surface treatment comprises a terminal alkoxy silane group. One approach to incorporating terminal alkoxy silane groups into the polymer is by use of 3-mercaptopropyl trimethoxysilane. This compound is commonly used as a chain transfer agent and an end-capping unit in the polymerization of acrylic copolymers.

In some embodiments, the polymeric silane surface treatment may comprise repeat units derived from one or more other (meth)acrylate monomer. In some embodiments, a (e.g. (meth)acrylate) monomer having a refractive index of at least 1.50, or 1.51, or 1.52, or 1.53, or 1.54 or greater may be employed to raise the refractive index of the polymeric silane surface treatment and thus optical coupling layer comprising such. Various high refractive index monomers are known. Such monomers typically comprise at least one aromatic group and/or sulfur atoms. Typically the concentration of these other (meth)acrylate monomers is no greater than 10-wt-% or 5-wt-% of the optical coupling composition.

The high index particles may optionally comprise a second surface treatment that is not a polymeric surface treatment. Generally, non-polymeric surface modifying agents do not have any polymerized or copolymerized repeat units. In some embodiments, the non-polymeric surface modifying agents have molecular weight of less than 1500 gm/mole, or less than 1000 gm/mole, or less than 500 gm/mole. Examples of non-polymeric surface modifying agents include trialkoxy alkyl silanes and trialkoxy aryl silanes. In some embodiments, a non-polymeric surface treatment has a refractive index of at least 1.50, or 1.51, or 1.52, or 1.53, or 1.54. Inclusion of a high index surface treatment can contribute to the high refractive index of the surface modified high refractive index nanoparticles. Phenyltrimethoxy silane is one example of a suitable non-polymeric surface treatment. The concentration of non-polymeric surface treatment is generally relatively low as compared to the polymeric silane surface treatment. For example, the concentration is typically no greater than 5 wt.-%, or 7.5 wt-%, or 10 wt-% of the surface modified nanoparticles.

In some embodiments, the coating composition may consist entirely of the surface treated inorganic nanoparticles. Thus, the polymeric silane surface treatment may be the sole polymeric component of the optical coupling layer. The optical coupling layer typically comprises at least 30 wt. %, or 31 wt. %, or 32 wt. %, or 33 wt. %, or 35 wt-% of polymeric silane surface treatment. In some embodiments, the concentration of polymeric silane surface treatment in the optical coupling layer is no greater than 60 wt. %, or 55 wt. %, or 50 wt. %, or 45 wt. %. In this embodiment, the coating composition may be substantially free of (meth) acrylate components (e.g. monomers and oligomers), particularly those having a molecular weight of 1,000 g/mole or less. By substantially free, it is meant that the composition comprises no greater than 5 wt. %, or 4 wt. %, or 3 wt. %, or 2 wt. %, or 1 wt-% of such (meth)acrylate components. It has been found that the inclusion of appreciable amounts of such monomers can crack the OLED device during curing. However, small concentrations of higher molecular weight monomers (greater than 1,000 g/mole) and especially polymers, commonly referred to as polymeric binders may be added. In some embodiments, the optical coupling layer may comprise up to 10 wt-% of polymeric binders. However, in favored embodiments, the optical coupling composition is free of polymeric binders.

Although the properties of the PSAs can be modified with common additives such as tackifiers and plasticizers, in some favored embodiments coating composition useful as an optical coupling layer comprises little or no tackifiers and plasticizers. In some embodiments, the total amount of tackifier in combination with plasticizer is no greater than 10 wt.-%, or 5 wt.-%, or 2 wt. %, or 1 wt. %.

The surface modified high index nanoparticles are generally prepared by combining a weakly acid sol (pH=4-5) with the polymeric silane surface treatment and optional non-polymeric surface treatment. The mixture was then heated for overnight to complete the coupling reaction at the particle surfaces. After that, the polymer modified particles was transferred into organic solvents after removing all the water using raotary evaporator.

The solvent is typically removed either prior to applying to the (e.g. light extraction) optical films or prior to applying the optical coupling layer to a substrate (e.g. OLED). Hence, the optical coupling layer is substantially solvent free when laminated. By substantially solvent free it is mean that the topical coupling layer comprises less than 1 wt.-% solvent. It has been found that the inclusion of appreciable amounts of solvents can render the OLED inoperable over time.

In some embodiments, the dried and optionally cured coating compositions exhibit pressure sensitive adhesive properties. One characteristic of a pressure sensitive adhesive is tack. The probe tack of the optical coupling layer composition (as measured according to the test method described in the forthcoming examples) is typically at least 5 grams. In favored embodiments, the tack is at least 30, 40 or 50 grams. In some embodiments the tack is no greater than 150 or 100 grams. Another characteristic of a pressure sensitive adhesive composition is peel force. The peak peel force (as measured according to the test method described in the forthcoming examples) is typically at least 40, or 50 or 60 grams/cm and in some embodiments, at least 70 or 80 grams/cm. In some embodiments, the peak peel force is no greater than 200 or 150 grams/cm. The minimum peel force is typically ranges from 1 or 2 grams/cm to 10, 15, or 20 grams/cm. The average peel force is typically at least 10 or 15 grams/cm and in some embodiments at least 20 or 30 grams/cm. In some embodiments, the average peak force is no greater than 100, or 80, or 60 grams/cm.

EXAMPLES

All parts, percentages, ratios, etc. in the examples are by weight, unless noted otherwise. Solvents and other reagents used were obtained from Sigma-Aldrich Chemical Company; Milwaukee, Wis. unless specified differently.

Materials

| Abbreviation/product name | Description | Available from |
|---|---|---|
| 3-mercaptopropyl trimethoxysilane | Chain Transfer Agent, 95% | Alfa Aesar, Ward Hill, MA |
| Bis[4-(2,3-epoxypropylthio)phenyl]sulfide | Epoxy with a high refractive index (RI = 1.67) | Sumitomo Seika, Hyogo, Japan |
| DER331 | Epoxy Resin | Dow Chemical Company, Midland, Michigan |
| Desmodur ® N3300 | Aliphatic polyisocyanate | Bayer Material Science, Pittsburgh, PA |
| DMAEMA | 2-(Dimethylamino)ethyl methacrylate | Sigma-Aldrich Chemical Company, Milwaukee, WI |
| Isooctyl Acrylate | Isooctyl Acrylate | Sigma-Aldrich Chemical Company, Milwaukee, WI |
| hydroxyethy acrylate | hydroxyethyl acrylate | Alfa Aesar, Ward Hill, MA |
| ethyl acetate | solvent | Honeywell International, Inc., Morristown, NJ. |
| IPDI | Isophorone diisocyanate | Toyo Chemical Industry Co., Ltd, Tokyo, Japan |
| NTB-1 | 15% wt aqueous titanium dioxide sol with pH at 4 | Denko Corporation, Japan |
| PHOTOMER 6210 | aliphatic urethane diacrylate | Cognis Corporation, Cincinnati, OH |
| Phenyltrimethoxysilane | Silane surface treatment, 97% | Alfa Aesar, Ward Hill, MA |
| PM | 1-methoxy-2-propanol | Alfa Aesar, Ward Hill, MA |
| SR238 | 1,6 hexanediol diacrylate | Sartomer Company, Exton, PA |
| Vazo 67 | 2,2'-Azobis(2-methylbutyronitrile) | Sigma-Aldrich Chemical Company, Milwaukee, WI |

Various silane functional polymers were prepared by solution polymerization in ethyl acetate ("EthAc") as follows.

PREPARATIVE EXAMPLES

Synthesis of Silane Functional Polymers

Synthesis of Polymer-I

In an 8 ounce bottle, 27 g of isooctyl acrylate, 3.0 g of hydroxyethyl acrylate, 7.4 g of 3-mercaptopropyl trimethoxysilane, 80 g ethyl acetate, and 0.15 g of Vazo 67 were mixed together. The mixture was bubbled under $N_2$ for 20 min, then, the mixture was placed in an oil bath at 70° C. for 24 hours. This resulted in an optical clear solution with wt % solids of 30.9%.

Synthesis of Polymer-II

In an 8 ounce bottle, 27 g of isooctyl acrylate, 3.0 g of hydroxyethyl acrylate, 3.7 g of 3-mercaptopropyl trimethoxysilane, 80 g ethyl acetate, and 0.15 g of Vazo 67 were mixture together. The mixture was bubbled under $N_2$ for 20 min, then, the mixture was placed in an oil bath at 70° C. for 24 hours. This resulted in an optical clear solution with a wt % solids of 31.04%.

Synthesis of Polymer-III

In an 8 ounce bottle, 27 g of isooctyl acrylate, 3 g of DMAEMA, 3.7 g of 3-mercaptopropyl trimethoxysilane, 80 g ethyl acetate, and 0.15 g of Vazo 67 were mixture together. The mixture was bubbled under $N_2$ for 20 min, then, the mixture was placed in an oil bath at 70° C. for 24 hours. This resulted in an optical clear solution with a wt % solids of 30.8%.

Synthesis of Polymer-IV

In an 8 ounce bottle, 29.4 g of isooctyl acrylate, 0.6 g of acrylic acid, 3.7 g of 3-mercaptopropyl trimethoxysilane, 80 g ethyl acetate, and 0.15 g of Vazo 67 were mixture together. The mixture was bubbled under $N_2$ for 20 min, then, the mixture was placed in an oil bath at 70° C. for 24 hours. This resulted in an optical clear solution with wt % solids of 30.8%.

Preparation of Backfilled Light Extraction Film

A nanostructured film fabricated by first making a multi-tipped diamond tool using focused ion beam (FIB) milling as described in U.S. Pat. No. 7,140,812. The diamond tool was then used to make a copper micro-replication roll which was then used to make 400 nm-pitch linear triangular-waveform structures on a PET film in a continuous cast and cure process utilizing a polymerizable resin made by mixing 0.5% (2,4,6 trimethyl benzoyl) diphenyl phosphine oxide into a 75:25 blend of PHOTOMER 6210 and SR238. The nanostructured film was backfilled with an approximately 2 μm thick high-refractive index backfill layer as described in US Patent Application Publication 2012/0234460.

Test Methods

Tack Measurement

A TA.XT Plus Texture Analyzer (available from Texture Technologies Corp, Scarsdale, N.Y.) with a 6 mm hemispheric probe was used for tack testing. The following settings were used: pre-test speed 0.50 mm/sec, test speed 0.01 mm/sec, post test speed 0.05 mm/sec, applied force 100.0 grams, return distance 5.00 mm, contact time 30 sec, trigger type auto, trigger force 5.0 grams, tare mode auto, proportional gain 50, integral gain 20, differential gain 5, and max tracking speed 0.00 mm/sec.

The tests were conducted as follows. A 12.7 cm×2.5 cm (5 inch×1 inch) strip of coated sample taken from a middle section of a coating was laminated to the back of a 0.64 cm (¼ inch) thick by 2.5 cm×15.2 cm (1 inch×6 inch) bar and slid into a holding fixture directly underneath the test probe. The probe was allowed to sit on sample for 30 seconds after making contact to allow the relaxation of the coating. Four measurements were taken along each sample strip. If a data point was an outlier it was discarded and the average peak force determined from the remaining data.

Peel Tests

Samples were prepared by coating the optical coupling solution onto the backfill side of the backfilled light extraction film described above. The light extraction film was taped down to a flat surface and the coating was applied with a #30 Meyer bar. The coating was heated at 65° C. for 10 minutes. All coatings yielded a dry adhesive thickness of 10-12 microns. The dried coating was then laminated to a barrier film using a hand roller. The barrier film was as described in Example 1 of U.S. Pat. No. 7,468,211. T-peel tests were conducted on an IMASS SP-2000 slip-peel tester (from Instrumentors Inc., Strongsville Ohio) with 2.5 cm (1 inch) wide strips at a peel rate of (5 inch/min) over 25 seconds. The peak force, the minimum force occurring after the first peak, and the average of the force over the 25 second test were recorded and averaged over three test samples.

Shear Tests

Shear test samples were prepared by coating optical coupling materials on light extraction film as described for the Peel Test. The films were then cut and adhered to a stainless steel plate with a contact area of 1.3 cm×1.3 cm (0.5 inch×0.5 inch) or 2.5 cm×2.5 cm (1 inch×1 inch). The excess tape strip was fastened to either a 0.5 kg or 1 kg weight. The assemblies were allowed to hang vertically, therefore measuring the shear of the adhesive. The time required for the adhesive to fail was recorded.

Molecular Weight

The weight average, (Mw) molecular weight of each of the polymers was determined by Gel Permeation Chromatography. Results are provided in the table below.

Glass Transition Temperature

Samples were prepared by pouring 3 grams of the solution to be tested onto a release liner and drying at 25° C. for 18 hours and then placing the samples into a oven at 65° C. for 10 minutes. The glass transition temperature was then measured using a TA Instruments (New Castle, Del.) Model Q200 Differential Scanning calorimeter (DSC) run in Modulated DSC mode.

Polymeric Silane Surface Treatments

| | Monomers | Weight Ratio | Monomers/ MPTMS Ratio | MW (g/mol) | Tg (° C.) |
|---|---|---|---|---|---|
| Polymer-I | IOA:HEA | 90:10 | 80.2/19.8 | | |
| Polymer-II | IOA:HEA | 90:10 | 89/11 | 2670 | −63.3 |
| Polymer-III | IOA:EMADMA | 90:10 | 89/11 | 3060 | |
| Polymer-IV | IOA:AA | 98:2 | 89/11 | 3840 | |

$TiO_2$ Nanoparticles Comprising a Polymeric Silane Surface Treatment

Into a 2 L round-bottom flask equipped with a dropping funnel, temperature controller, paddle stirrer, and distilling head, was charged 177 g of NTB-1 sol and 200 g of 1-methoxy-2-propanol, which were mixed together. 3.24 g of phenyltrimethoxysilane, 30 g of toluene, and the polymer solution specified in the table below was added under rapid stirring. After 15 min, the temperature was raised to 48° C. and an additional 240 g of toluene was added. The mixture was then heated to 80° C. for 16 hours.

The temperature was allowed to return to room temperature and the mixture was then transferred into a round flask. The solvent was removed using a rotary evaporator to yield a white wet-cake like materials. Then an additional 400 g of toluene was added. The solvents were further removed using a rotary evaporator. The final product was a dispersion of surface treated $TiO_2$ nanoparticles in toluene. The weight percent solids in the dispersions are given in the table below.

The solutions were coated on primed PET using a glass rod. The coated samples were dried in a vacuum oven for 5 minutes at 65° C. After drying, the samples yielded optically clear and sticky coatings with bluish color in thick areas. The tack was measured as described above and the refractive indexes of the materials were measured using a Metricon MODEL 2010 prism coupler (Metricon Corporation Inc. Pennington, N.J.) at 632.8 nm and are reported in the table below.

$TiO_2$ Surface Treated with the Silane Functional Polymers of Table 1

| Example | Polymer | Weight % Solids of $TiO_2$ Dispersion | $TiO_2$/ Polymer Solids Weight Ratio | RI | Tg (° C.) | Tack (decoupling force from probe, grams) |
|---|---|---|---|---|---|---|
| 1 | Polymer-I | 33.62 | 69.3:30.7 | 1.78 | | 6.3 |
| 2 | Polymer-II | 36.66 | 59.7:40.3 | 1.71 | −43.3 | 73.6 |
| 3 | Polymer-III | 39.5 | 60.2:39.8 | 1.72 | | 60.0 |
| 4 | Polymer-IV | 27.58 | 60.2:39.8 | 1.73 | | |

The glass transition temperature of the adhesive prepared according to Example 2 was determined according to the test method previously described and found to be −43° C. An additional glass transition temperature of Example 2 was observed at 65.7° C., which is corresponding to the phenyl-silane that was bonded to the nanoparticle surfaces.

Example 5

Into a small jar, 20 g of the solution made according to Example 2 and 0.168 g of Desmodur® N3300 polyisocyanate was added. The mixture was ultrasonic treated for 5 min to a good mixture. Then, the solution was coated on a primed PET surface using a glass rod. The resulting bluish coating was heated in an oven at 70° C. or 3 hours. The resulting film was found to be sticky. The refractive index was 1.69.

Example 6

Into a small jar, 10.1 g of the solution made according to Example 2 and 0.0927 g of bis[4-(2,3-epoxypropylthio)phenyl]sulfide was added. The mixture was ultrasonic treated for 5 min to a good mixture. Then, the solution was coated on a primed PET surface using a glass rod. The resulting bluish coating was heated in an oven at 70° C. or 3 hours. The resulting film was found to be sticky. The refractive index was 1.72.

Example 7

In a 3-necked flask, 180 g of NTB-01 $TiO_2$ sol (15% wt), 91 g of Polymer-II prepared above, 230 g of PM and 50 g of toluene were added together, the mixture was stirred at room temp for 30 min. Then the temp of mixture was heated to 45° C., an additional 220 g of toluene was added. The final mixture was heated to 80° C. for 16 hours.

Then the temperature was allowed to return to room temp. The mixture was then transferred into a round flask and the solvent was removed using rotary evaporator to yield a white wet-cake like materials. Then an additional 800 g of toluene was added. The solvents were further removed using a rotary evaporator. The final product was a dispersion of Polymer-II modified $TiO_2$ nanoparticles in toluene at about 31.8% wt solid.

Example 7 was cast on PET film and dried at room temperature. The refractive index of the resulting transparent sticky solid was 1.65.

Peel tests and shear tests were conducted on the Polymer-II modified $TiO_2$ solution according to the test methods previously described. Peel and shear tests were also conducted on additional samples prepared by adding 1% IPDI or 1% DER331 epoxy to the Polymer-II modified $TiO_2$ solutions. All peels were shocky with split (cohesive failure) during the peak value. Cohesive failure was also observed in the shear tests. The results are as follows.

|  | Crosslinker | Peak Peel Force grams/cm (oz/inch) | Minimum Peel Force grams/cm (oz/inch) | Average Peel Force grams/cm (oz/inch) | Time to Shear Failure* (min) |
|---|---|---|---|---|---|
| Example 2 | None | 60.2 (5.39) | 3.7 (0.33) | 18.2 (1.63) | 22 |
| Example 8 | 1% IPDI | 87.6 (7.85) | 2.5 (0.22) | 42.2 (3.78) | 33 |
| Example 9 | 1% DER331 | 109 (9.74) | 4.5 (0.40) | 34.6 (3.10) | 27 |

*Measured with 1 kg weight and 1.3 cm × 1.3 cm contact area. Samples tested with a 0.5 kg weight and 2.5 cm × 2.5 cm contact area did not fail after longer than 10,000 minutes.

Coatings were prepared on primed PET for optical testing using a #30 Meyer rod resulting in a coating thickness of about 10 microns. The coated samples were dried in a vacuum oven for 5 minutes at 65° C. The transmission, haze and clarity were measured using a HazeGard Plus (BYK-Gardner USA, Columbia, Md.). The measurements were taken on three sections near the central region of each sample and averaged. The results are reported in the table below.

| Example | Polymer | Transmission (%) | Haze (%) | Clarity (%) |
|---|---|---|---|---|
| PET | No coating | 91.53 | 0.54 | 100.00 |
| 1 | Polymer-I | 85.43 | 1.82 | 99.83 |
| 2 | Polymer-II | 86.17 | 2.10 | 99.50 |
| 3 | Polymer-III | 86.80 | 1.47 | 99.73 |
| 7 | Polymer-II | 85.83 | 2.90 | 98.9 |

Comparative Example C-1: Fabrication of Top Emissive OLEDs (without a Light Extraction Film and Optical Coupling Layer)

Approximately 2 nm of Chromium (Cr) and 100 nm of Silver (Ag) were pre-coated onto 0.7 mm-thick polished soda-lime glass samples (Delta Technologies, Stillwater, USA) substrates by standard thermal deposition in a vacuum system at base pressure of about 10' Torr. Subsequently, a 10 nm thick Indium-Tin-Oxide (ITO) layer was vacuum sputtered under direct current conditions (400 W forward power) onto the glass/Cr/Ag substrates to complete the bottom OLED electrode fabrication (bottom-electrode shadow masks were used for Cr, Ag and ITO coatings). Following the ITO sputtering process, a layer of approximately 500 nm thick photoresist (TELR-P003 PM, TOK America) was spin-coated and photolithographically patterned according to a pre-defined pattern and hard-baked at 230° C. to define a finished substrate for top-emissive (TE) OLED fabrication.

The following OLED construction was deposited for green-emissive TE OLED device using shadow masks designed for organic layer depositions:

EIL (20 nm)/ETL (25 nm)/EML (30 nm)/HTL2 (10 nm)/HTL1 (165 nm)/HIL (100 nm), where EIL is an electron injection layer, ETL is an electron transport layer, EML is an emissive layer with green electroluminescence characteristics, HTL1 and HTL2 are hole transport layers, and $MoO_3$ was used as the hole injection layer (HIL). All the layers above were fabricated by standard thermal deposition in a vacuum system at base pressure of about 10' Torr.

Following the organic layer deposition, approximately 80 nm thick ITO was vacuum sputtered under direct current conditions (400 W forward power) using a shadow mask designed for the top-electrode.

Finally, the TE OLED device was completed by coating an additional 200 nm of $MoO_3$ as a capping layer onto the ITO top electrode using a shadow mask similar to that used for coating OLED organic layers. The MoO$_3$ layer was fabricated by standard thermal deposition in a vacuum system at base pressure of about 10$^{-6}$ Torr.

After completion, the TE OLEDs were encapsulated with glass cap and UV-curable epoxy (Nagase Corp., Japan) applied and cured by the perimeter of the glass cap. Moisture absorbing desiccant was included into the package prior to encapsulation to improve device stability.

Lamination of OLED Light Extraction Film onto Top Emitting OLED Using Optical Coupling Layer A backfilled light extraction films was prepared as previously described. Prior to lamination, the optical coupling coating compositions of Examples 2-4 were coated from solutions onto backfilled light extraction films using a Myre bar #30. Each coating was then dried in vacuum at 60° C. for 5 minutes to evaporate the solvent and to form a gel optical coupling layer on the film surface and was immediately transferred in to an inert glovebox. This was followed by a pre-bake at 80° C. for approximately 5 minutes in order to dry out any moisture captured during transfer into glovebox. TE OLED samples were fabricated according to the procedure described in Comparative Example C-1. Prior to encapsulating the devices with glass as described in Comparative Example C-1, the extractor films with m-based OCLs were laminated onto the devices. Following the lamination, the devices were encapsulated as described in Comparative Example C-1.

The fabricated TE OLEDs of Comparative Example C-1 and those prepared from Examples 2-4 were analyzed using a variety of OLED characterization techniques such as luminance-current-voltage (LIV) test using Keithley 2400™ source meter and PR650 photopic camera (Photo Research Inc., USA), angular luminance measurements using Autronic™ Conoscope (Autronic Melchers GmbH, Karsruhe, Germany), and goniometry measurements of efficiency and electroluminescence spectra at different viewing angles using PR650 camera and a manual goniometer constructed in house. In the LIV test, the devices were subjected to a DC current sweep typically in the range of 4 to 20 mA/cm' current density. In angular conoscopic and goniometric measurements, all devices were operated under constant current corresponding to 10 mA/cm' current density for each operated device.

The table below gives axial and integrated optical gains of the devices with extractor laminated using Polymer-based OCL materials. The gains were calculated as luminance (axial) and luminous intensity (integrated) of laminated extractor devices divided by those values of control samples (Comparative Example C-1) prepared on the same test coupon. The axial luminance and integrated luminous intensity data was obtained using conoscopic tests as described above. The axial gain represents the extraction efficiency along the normal viewing direction relative to the device light output surface, and integrated gain reflects extraction efficiency in all directions of light emitted from the light output surface of the OLED device.

| Optical Coupling Composition | Axial Gain Mean (St. Dev.) | Integrated Gain Mean (St. Dev.) |
|---|---|---|
| Example | | |
| Comparative C-1 No light extraction film | 1 | 1 |
| 2 | 2.6 (0.3) | 1.8 (0.2) |
| 3 | 2.5 (0.6) | 1.8 (0.4) |
| 4 | 2.3 (0.1) | 1.7 (0.2) |

The optical coupling layer of Example 1 was also tested and was found to be less preferred due to increased stiffness in view of comprising a lower concentration of polymeric silane surface treatment.

What is claimed is:

1. A coating composition comprising:
   solvent:
   at least 40 wt.-% inorganic nanoparticles having a refractive index of at least 1.85; and
   a polymeric silane surface treatment having a weight average molecular weight ranging from 1000 to 5000 g/mole; wherein the coating composition further comprises polymeric binder in an amount up to 10 wt.-% solids of the coating composition and a coating prepared from the coating composition has a refractive index of at least 1.65 upon removal of the solvent.

2. The coating composition of claim 1 wherein the polymeric silane surface treatment comprises a random acrylic copolymer comprising at least 50 wt.-% of repeat units derived from one or more alkyl (meth)acrylate monomers comprising 4 to 18 carbon atoms.

3. The coating composition of claim 1 wherein the polymeric silane surface treatment has a Tg ranging from −20° C. to −80° C.

4. The coating composition of claim 1 wherein the inorganic nanoparticles further comprise a non-polymeric surface treatment.

5. The coating composition of claim 4 wherein the non-polymeric surface treatment has a refractive index of at least 1.50.

6. The coating composition of claim 1 wherein the coating has a refractive index of at least 1.70.

7. The coating composition of claim 1s 1-10 wherein the inorganic nanoparticles comprise titania.

8. The coating composition of claim 1 wherein the polymeric silane surface treatment comprises repeat units comprising pendant reactive groups selected from hydroxyl groups, acid groups, or amine groups.

9. The coating composition of claim 8 wherein the coating composition comprises a crosslinker that crosslinks the pendant reactive groups.

10. The coating composition of claim 1 wherein the coating has a peak peel force of at least 50 g/cm.

11. A substrate comprising the coating composition of claim 1.

12. A substrate comprising the coating composition of claim 1, wherein the solvent is removed.

* * * * *

UNITED STATES PATENT AND TRADEMARK OFFICE
CERTIFICATE OF CORRECTION

PATENT NO.          : 11,127,927 B2                                  Page 1 of 1
APPLICATION NO.     : 16/839115
DATED               : September 21, 2021
INVENTOR(S)         : Encai Hao It is certified that error appears in the above-identified patent and that said Letters Patent is hereby corrected as shown below:

In the Claims

<u>Column 20</u>
Line 43, In Claim 7, delete "Claim 1s 1-10" and insert -- Claim 1 --, therefor.

Signed and Sealed this
Twelfth Day of April, 2022

Drew Hirshfeld
*Performing the Functions and Duties of the*
*Under Secretary of Commerce for Intellectual Property and*
*Director of the United States Patent and Trademark Office*